United States Patent [19]

Brors et al.

[11] Patent Number: 5,551,985
[45] Date of Patent: Sep. 3, 1996

[54] METHOD AND APPARATUS FOR COLD WALL CHEMICAL VAPOR DEPOSITION

[75] Inventors: Daniel L. Brors, Byron; Robert C. Cook, San Jose, both of Calif.

[73] Assignee: Torrex Equipment Corporation, Livermore, Calif.

[21] Appl. No.: 517,045

[22] Filed: Aug. 18, 1995

[51] Int. Cl.⁶ .................................................. C23C 16/00
[52] U.S. Cl. ...................... 118/725; 118/724; 118/715; 392/411; 392/416; 392/418
[58] Field of Search .................... 118/715, 724, 118/725; 392/407, 411, 416, 418

[56] References Cited

U.S. PATENT DOCUMENTS

| | | | |
|---|---|---|---|
| 3,830,194 | 8/1974 | Benzing | 118/5 |
| 4,125,391 | 11/1978 | Van Laethem | 65/60 D |
| 4,493,977 | 1/1985 | Arai | 219/411 |
| 4,533,820 | 8/1985 | Shimizu | 219/411 |
| 4,817,558 | 4/1989 | Itoh | 118/725 |
| 4,836,138 | 6/1989 | Robinson | 118/666 |
| 4,854,263 | 8/1989 | Chang | 118/715 |
| 4,920,918 | 5/1990 | Adams | 118/724 |
| 4,993,358 | 2/1991 | Mahawili | 118/715 |
| 5,000,113 | 3/1991 | Wang | 118/723 |
| 5,085,887 | 2/1992 | Adams | 427/55 |
| 5,113,929 | 5/1992 | Nakagawa | 165/61 |
| 5,148,714 | 9/1992 | McDiarmid | 74/89.15 |
| 5,156,820 | 10/1992 | Wong | 422/186.05 |
| 5,179,677 | 1/1993 | Anderson | 392/411 |
| 5,215,588 | 6/1993 | Rhieu | 118/715 |
| 5,269,847 | 12/1993 | Anderson | 118/715 |
| 5,305,417 | 4/1994 | Najm | 392/418 |
| 5,444,815 | 8/1995 | Lee | 392/416 |
| 5,445,675 | 8/1995 | Kubodera | 118/719 |
| 5,446,825 | 8/1995 | Moslehi | 392/416 |
| 5,487,127 | 1/1996 | Gronet | 392/416 |

FOREIGN PATENT DOCUMENTS

| | | | |
|---|---|---|---|
| 4-243122 | 8/1992 | Japan | 118/724 |
| 5-13355 | 1/1993 | Japan | 392/416 |

*Primary Examiner*—Nam Nguyen
*Assistant Examiner*—Jeffrie R. Lund
*Attorney, Agent, or Firm*—Skjerven, Morrill, MacPherson, Franklin & Friel; William L. Paradice, III; David E. Steuber

[57] ABSTRACT

A CVD reactor includes a vacuum chamber having first and second thermal plates disposed therein and two independently-controlled multiple-zone heat sources disposed around the exterior thereof. The first heat source has three zones and the second heat source has two zones. A wafer to be processed is positioned below the first thermal plate and immediately above the second thermal plate, thereby being indirectly heated from above by the first heat source via the first thermal plate and indirectly heated from below by the first zone of the second heat source via the second thermal plate. A thermal ring plate which laterally surrounds the edge of the wafer absorbs heat energy emitted from the second zone of the second heat source and heats the outer edge of the wafer. First and second sensors embedded in the first thermal plate and the thermal ring plate, respectively, measure and provide the respective temperatures thereof to a computer which, in response thereto, adjusts power to the three zones of the first heat source and the two zones of the second heat source to maintain the first thermal plate and the thermal ring plate, respectively, at a constant temperature. In this manner, a uniform temperature is maintained across the wafer.

9 Claims, 12 Drawing Sheets

METHOD AND APPARATUS FOR COLD WALL CHEMICAL VAPOR DEPOSITION

FIELD OF THE INVENTION

This invention relates to a cold wall Chemical Vapor Deposition (CVD) process chamber. More particularly, this invention relates to maintaining a wafer at a constant and uniform temperature in a vacuum chamber and controlling the injection of reactant gases into the chamber so that a uniform layer of thin film may be deposited on the wafer.

BACKGROUND OF THE INVENTION

Figure 1:
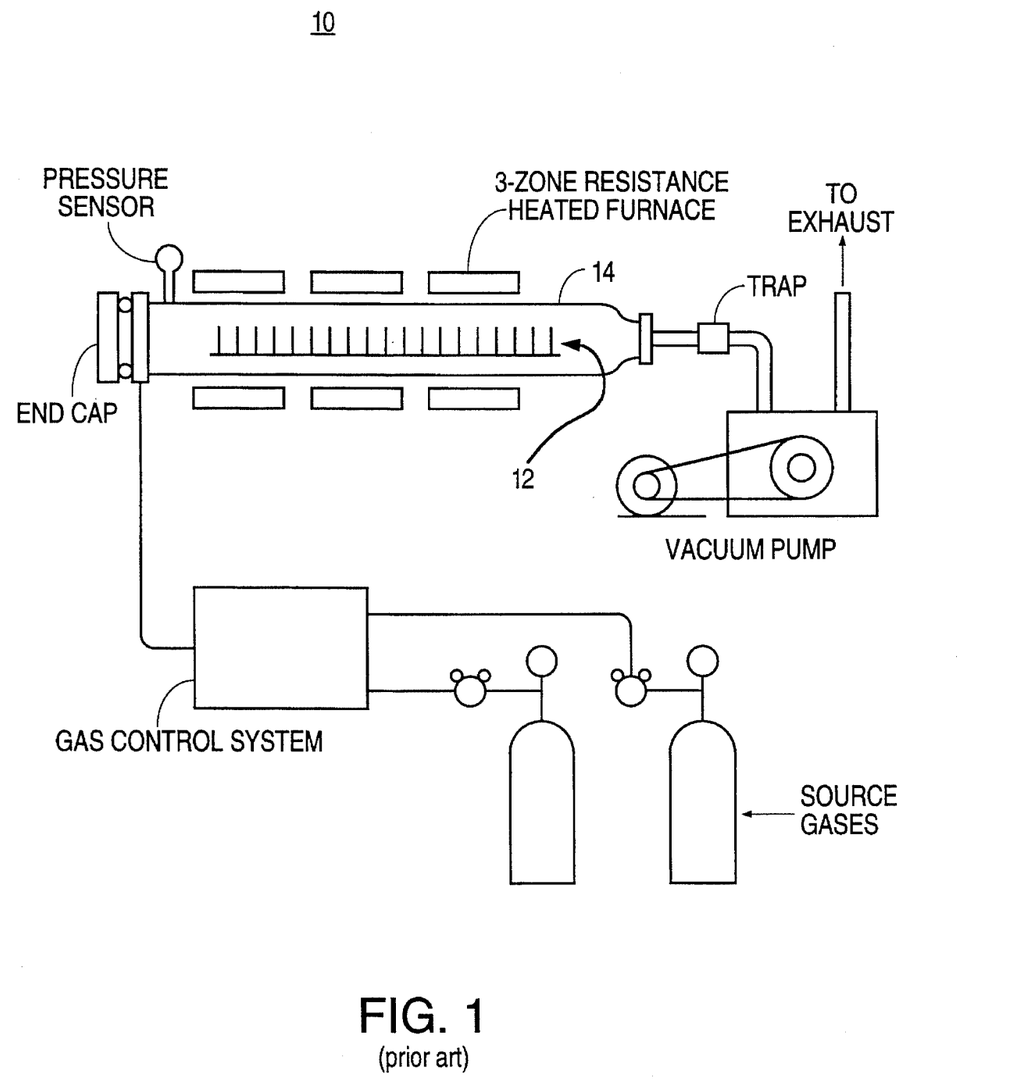
FIG. 1 illustrates a prior art hot wall CVD process chamber.

Polysilicon is widely used in the manufacture of semiconductor devices. Typically, polysilicon is deposited on silicon wafers by injecting silane or dichlorosilane and hydrogen in a hot wall CVD reactor 10 as is depicted in FIG. 1 and described by T. Kamins, Polycrystalline Silicon for Integrated Circuit Applications, Kluwer Academic Publishers, 1988, pp. 12–14, herein incorporated by reference.

A hot wall chamber such as the chamber 10 illustrated in FIG. 1 is, however, problematic. For instance, during CVD processing of wafers 12, the surface of chamber 10 becomes hot enough that a thin layer of the reactant vapor forms on the walls 14 of chamber 10. As this layer becomes thicker, it may break off of walls 14 and contaminate wafers 12. Further, the formation of such a layer may deplete the reactant species such that little or no vapor deposition occurs on the wafers 12.

In response to this problem, a "cold wall" process has been developed in which a silicon wafer is placed on a heating chuck and inserted into a vacuum chamber having induction coils provided on an outside surface thereof. The heating chuck absorbs RF energy from the induction coils, indirectly heating the wafer. The walls of the vacuum tube are transparent and non-obstructive to radiant heat energy such that the walls do not absorb RF energy emitted from the induction coils. Thus, the walls of the vacuum tube are relatively cool and remain well below the reaction temperature (i.e., the temperature of the wafers). Accordingly, very little vapor deposition occurs on the walls of the vacuum chamber.

Figure 2A:
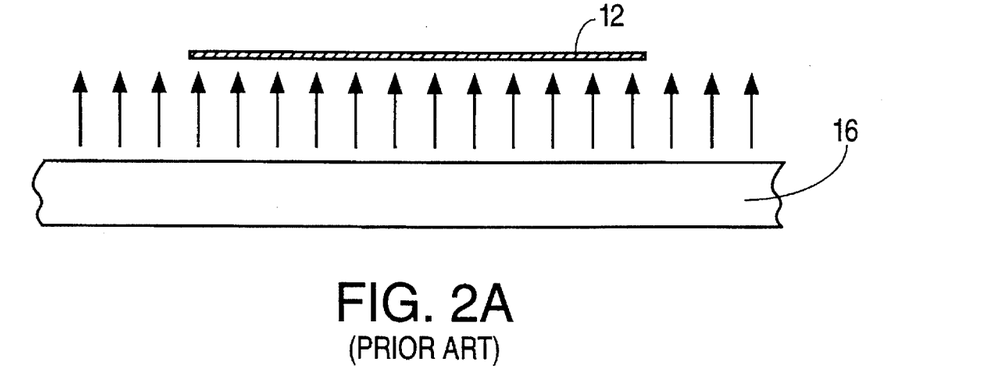
FIGS. 2A–2C illustrate the heat loss pattern of a silicon wafer processed in a cold wall CVD chamber.
Figure 2B:
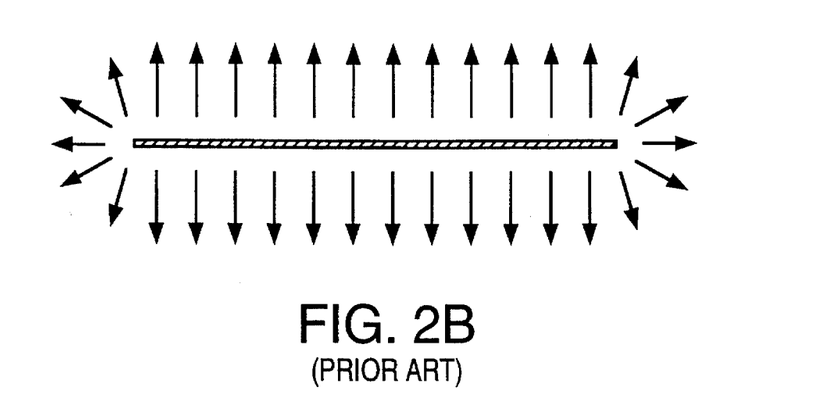
Figure 2C:
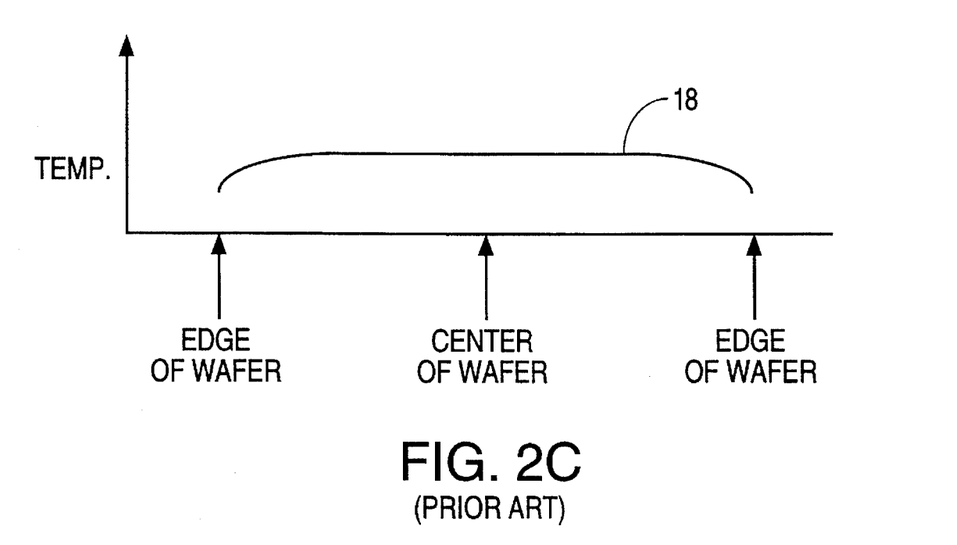

A significant limitation of the cold wall CVD reactor lies in its inability to uniformly heat each wafer. Simply applying heat in a uniform manner across a wafer results in significant temperature differences between the center and outer portions of the wafer. FIG. 2A shows a cross-sectional view of wafer 12 being heated uniformly by radiation emitted from a heat source 16 within a cold wall CVD reactor (not shown). FIG. 2B shows the typical pattern of radiative heat loss from wafer 12. The heat loss at the edge of wafer 12 is greater than heat loss of the center of wafer 12, resulting in a temperature difference between the edge and center of wafer 12. This temperature difference is illustrated graphically in FIG. 2C, where line 18 represents the temperature of wafer 12 as a function of distance across the cross-section of wafer 12 shown in FIG. 2B.

The deposition rate of a reactant gas upon wafer 12 is proportional to the temperature of wafer 12. Thus, temperature variations between the center and edge of wafer 12 will undesirably result in the deposition of a non-uniform layer of such material (i.e., a layer of non-uniform thickness). For instance, the deposition rate of polysilicon may vary 2.0–2.5 percent per degree Centigrade (see R. S. Rosler, Low Pressure CVD Production Process for Poly, Nitride, and Oxide, Solid State Technology, April 1977, pp. 63–70).

One approach to compensate for the higher heat loss at edge of a wafer is to apply more heat to the edge of the wafer by using a multi-zone heat source, as described by M. Moslehi et al, Texas Instruments Technical Journal, Vol. 9, No. 5, September, October. 1992, pp. 44–45. Unfortunately, such a technique is not completely effective. Since heat energy is not directional (i.e., it emits from a source in all directions), it is virtually impossible to direct this additional heat energy to only the edge of wafer 12. Some of the heat energy directed at the edge of wafer 12 will heat portions of wafer 12 as much as 5 mm away from the edge of wafer 12. Accordingly, there will still exist an undesirable variation in temperature between the edge and center of wafer 12.

A further problem of the cold wall CVD process is its limited processing speed. When the reactant gas is held at a low partial pressure, i.e., less than approximately 10 mTorr, its deposition rate is primarily a function of temperature. The deposition rate may be increased by increasing the partial pressure of the reactant gas. At higher partial pressures, however, the deposition rate becomes a function of not only temperature but also of the distribution pattern of the gas over the surface of the wafer. The high velocities at which the reactant gas enters the chamber, as well as the turbulence generated within the chamber due to reactant gases striking objects within the chamber, make it nearly impossible to achieve a truly laminar gas flow within the chamber. Thus, difficulties in accurately controlling the distribution pattern require the reactant gas to be held at low partial pressures in order to achieve a uniform deposition layer on wafer 12 which, in turn, undesirably limits the deposition rate.

The deposition of rate of polysilicon is typically on the order of 100–200 Å/min at 10 mTorr. In a typical hot wall CVD process, in which a hundred or more wafers may be simultaneously processed, such a deposition rate is acceptable. In a cold wall CVD process, however, only one wafer may be processed at a time. Accordingly, in a cold wall CVD device, a deposition rate on the order of 100–200 Å/min results in an unacceptably low wafer output. Thus, there is a need for a cold wall CVD device which exhibits an increased processing speed without any sacrifice in the uniformity of the deposited layer.

SUMMARY

An improved cold wall CVD reactor is disclosed which overcomes problems in the art described above. In accordance with the present invention, the CVD reactor includes a vacuum chamber having first and second thermal plates disposed therein and two independently-controlled multiple-zone heat sources disposed around the exterior thereof. The first heat source has three independently controlled zones and the second heat source has two independently controlled zones. A wafer which is to be processed is positioned below the first thermal plate and immediately above the second thermal plate. The wafer is indirectly heated from above by the first heat source via the first thermal plate and is indirectly heated from below by the first zone of the second heat source via the second thermal plate. A thermal ring plate which laterally surrounds the edge of the wafer absorbs heat energy emitted from the second portion of the second heat source and heats the outer edge of the wafer.

As the wafer is rotated at approximately 5 RPM, a reactant gas is injected into the chamber by a gas injector having a plurality of independently rotatable nozzles. The orientation and flow of gas through each nozzle may be adjusted such that the reactant gas is distributed in a highly uniform manner across the surface of the wafer. This high uniformity allows the partial pressure of the reactant gas to be increased, thereby increasing its deposition rate, without sacrificing the uniformity of the layer deposited upon the wafer.

A first sensor embedded in the first thermal plate measures the temperature of the first thermal plate and provides this temperature to a computer which, in turn, adjusts power to the first zone of the first heat source to maintain the first thermal plate at a constant temperature. The computer maintains the heat intensity of the second and third zones of the first heat source at a predetermined factor of heat intensity of the first zone such that a uniform temperature exists across the wafer.

A second sensor embedded in the thermal ring plate provides the temperature of the thermal ring plate to the computer. In response to this temperature, the computer adjusts the intensity of the second zone of the second heat source to maintain the thermal ring plate at a constant temperature. The computer maintains the intensity of the first zone of the second heat source at a predetermined factor of the intensity of the second zone such the wafer is held at a uniform temperature, i.e., to minimize temperature variations between the outer edge and the center of the wafer.

DETAILED DESCRIPTION OF THE PREFERRED EMBODIMENT

The description of the preferred embodiment is made with reference to FIGS. 3–11, where common parts are denoted with the same numerals. The operation of the above-described preferred embodiment will be discussed below in the context of the deposition of polysilicon on wafer 12. It is to be understood, however, that embodiments in accordance with the present invention may be used to deposit any suitable material on a wafer while still realizing the advantages of the present invention.

Referring first to FIGS. 3–6, a chemical vapor deposition (CVD) reactor 30 includes a vacuum chamber 32 having a top plate 34 and a base plate 36. Top plate 34 and base plate 36 are both water cooled. Side walls 38 are attached and vacuum sealed to top plate 34 with an 0-ring 38a and to base plate 36 with an 0-ring 38b (FIG. 5).

A wafer 12 which is to be processed in accordance with reactor 30 is placed inside chamber 32. Reactant gases are injected into chamber 32 via a gas injector 40 and are removed from chamber 32 using a suitable vacuum pump (not shown) via a hose 42. Infrared heat energy is applied to chamber 32 from a first heat source positioned above the wafer and from a second heat source positioned below the wafer, as will be described below.

Figure 3:
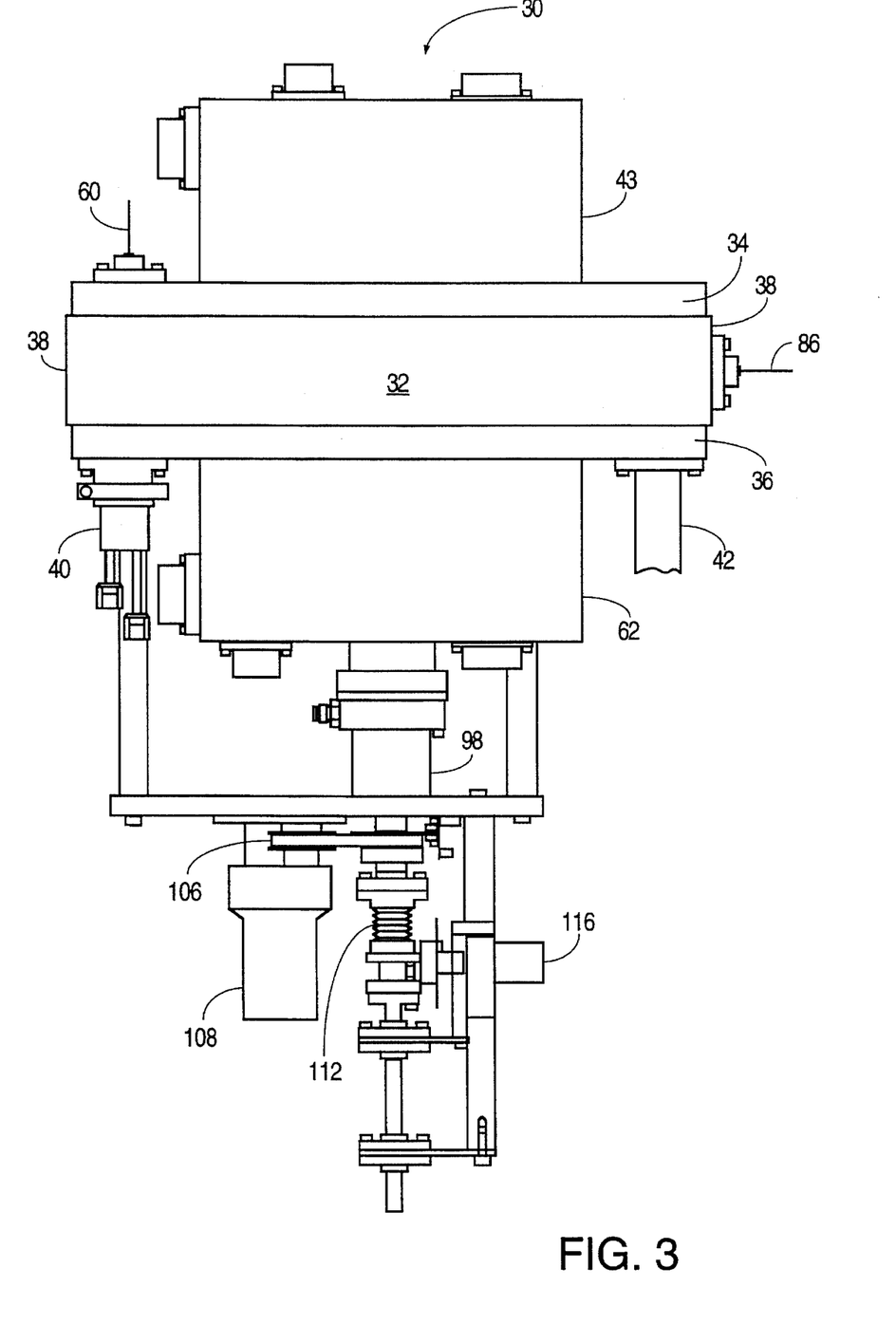
FIG. 3 is a front view of a CVD cold wall process reactor in accordance with the present invention.
Figure 4:
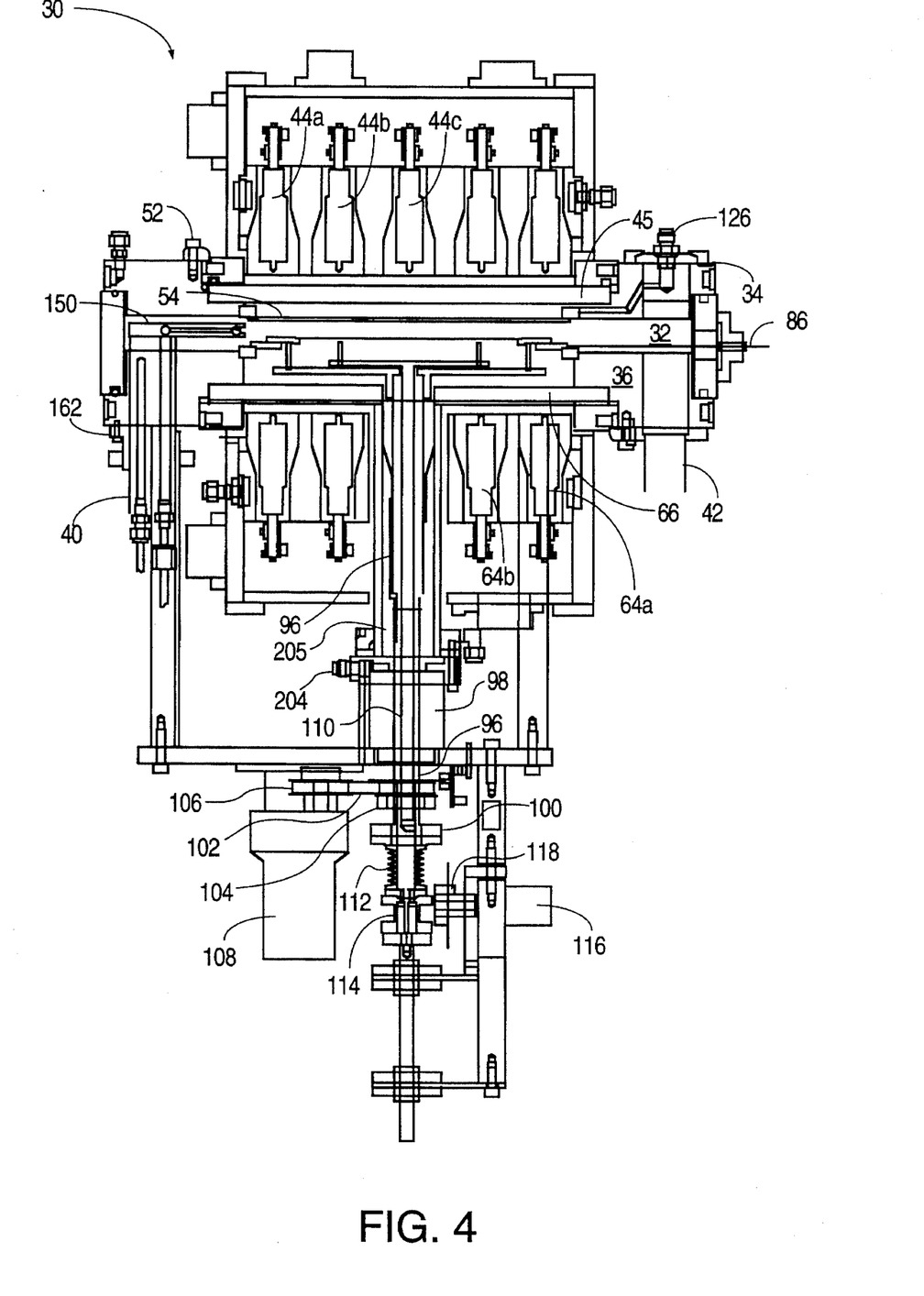
FIG. 4 is a front cross-sectional view of the CVD reactor of FIG. 4.

An upper lamp assembly 43 is disposed above top plate 34 (FIG. 3) and includes nineteen (19) two-kilowatt tungsten halogen lamps 44a–44c (FIG. 4). An upper quartz window 45, through which infrared energy emitted from lamps 44a–44c may pass and heat a wafer 12 situated in chamber 32, is mounted within top plate 34 and attached thereto by clamps 46. 0-rings 48, 49 form a vacuum seal between upper quartz window 45 and top plate 34 (FIG. 5). A graphite gasket 50 forms a seal between upper quartz window 45 and chamber 32. Clamps 46 apply a downward pressure on upper quartz window 45 to ensure a snug fit between upper quartz window 45 and graphite gasket 50. Clamps 46 are secured to top plate 34 by bolts 52 (FIGS. 4–6).

Figure 5:
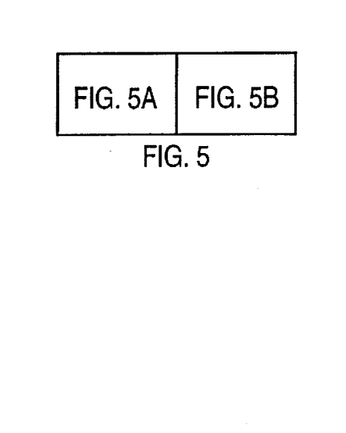
FIGS. 5A and 5B are a cross-sectional view of a vacuum chamber within the CVD reactor of FIGS. 3 and 4.
Figure 5A:
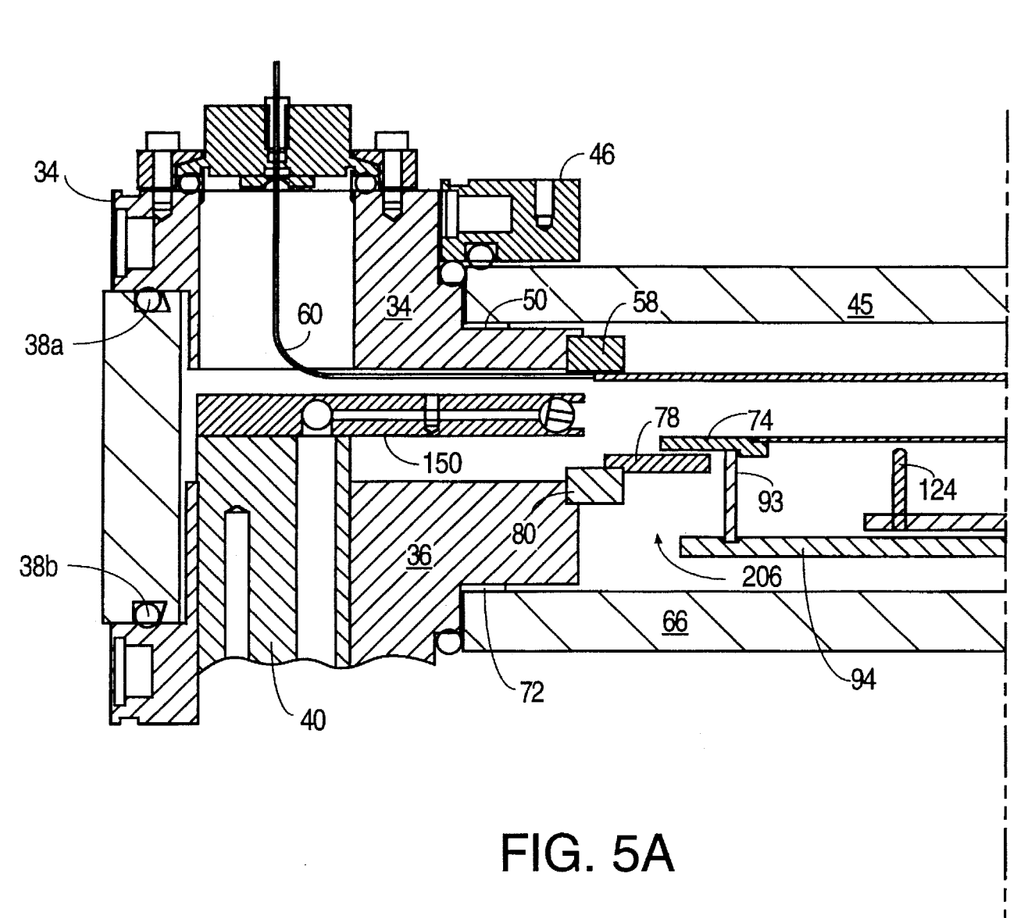
Figure 5B:
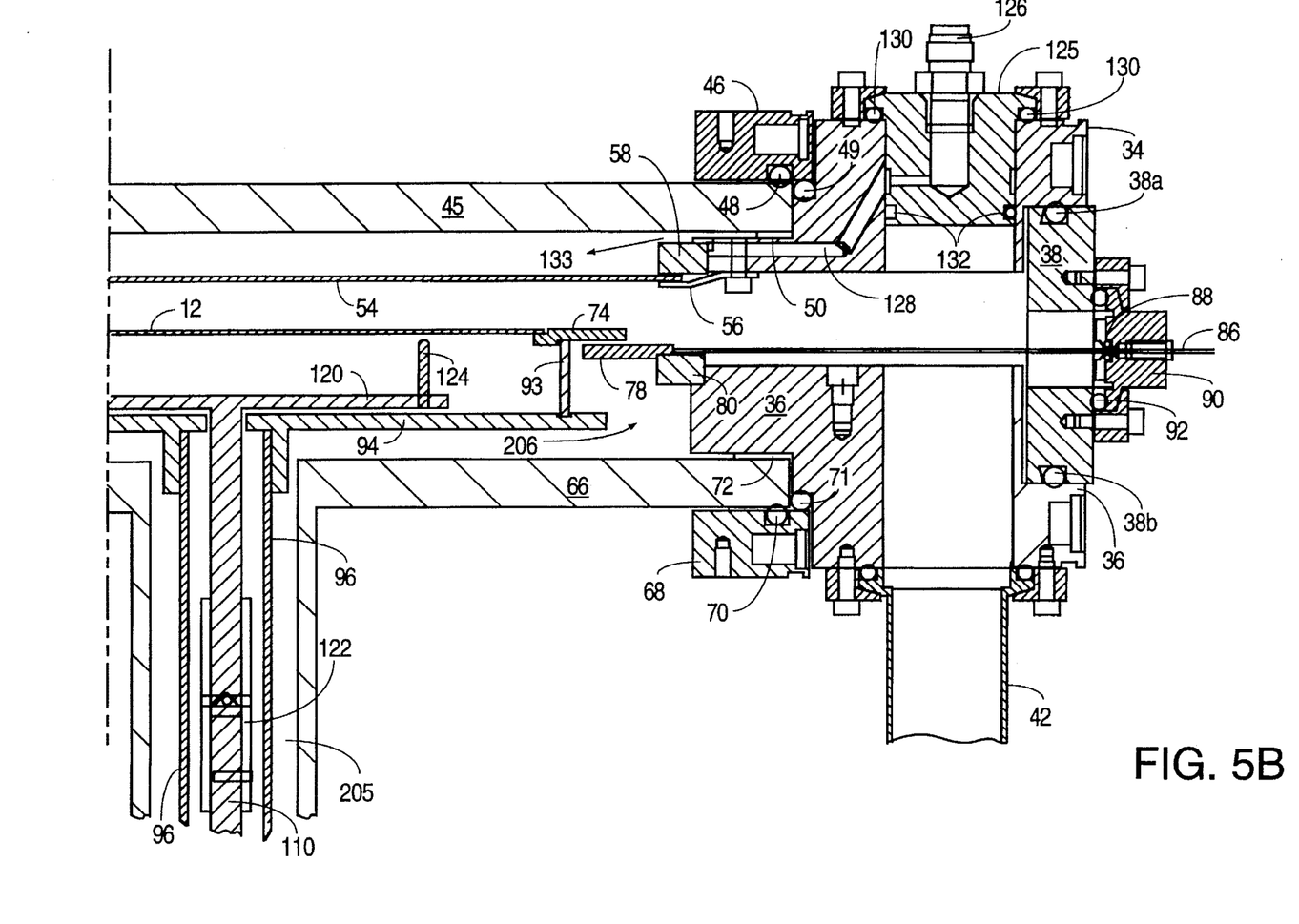
Figure 6:
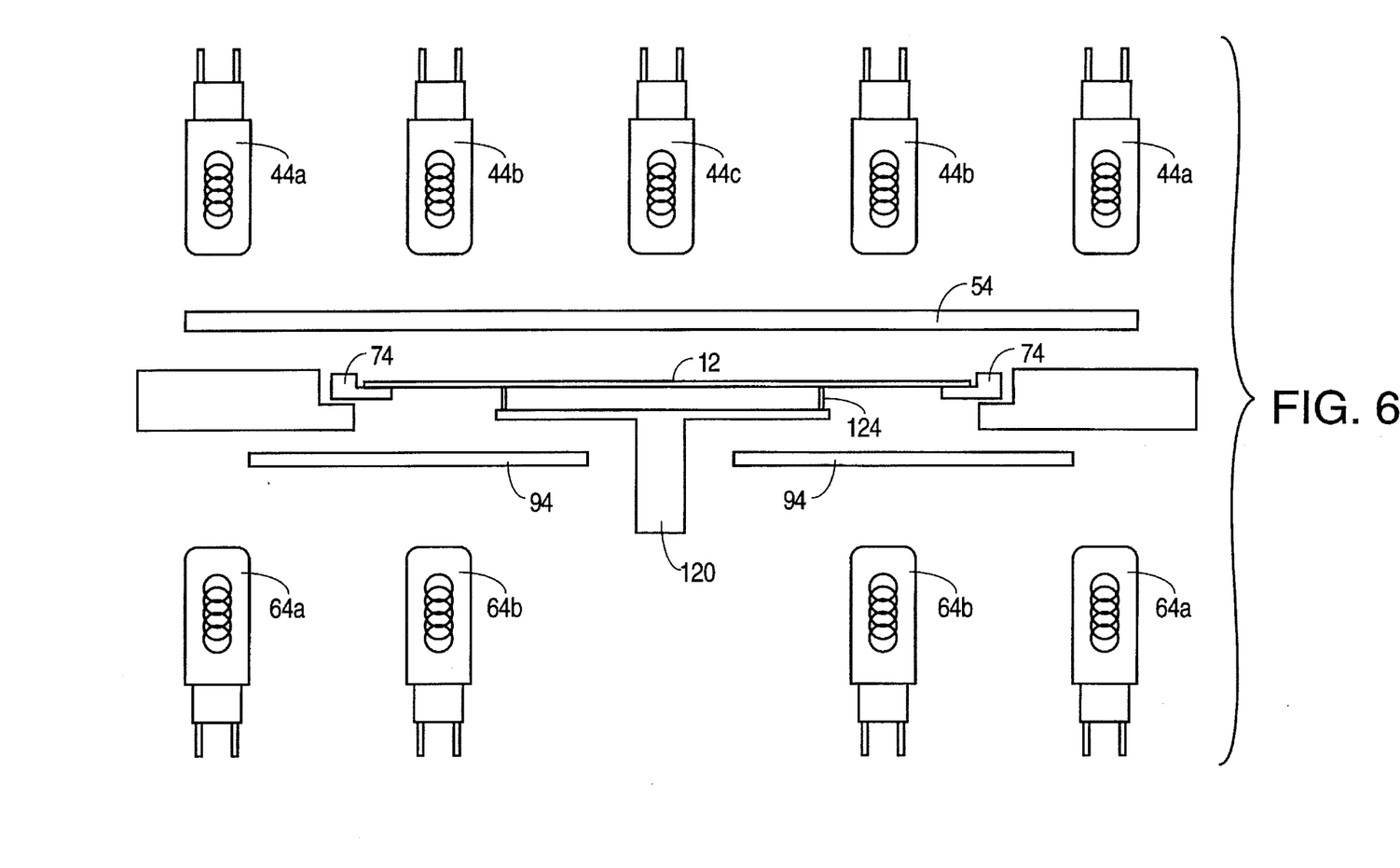
FIG. 6 is an exploded view of a portion of the vacuum chamber of FIGS. 5A and 5B showing also a multi-zone heating assembly in accordance with the present invention.

Infrared energy emitted from lamps 44a–44c in upper lamp assembly 43 heats a graphite thermal plate 54 positioned between approximately 0.5 and 0.75 inches above the top surface of wafer 12 (FIGS. 5 and 6). Thermal plate 54 preferably has a low thermal mass to allow for rapid thermal cycling of plate 54. A plurality of clips 56 secure thermal plate 54 against a thermal insulating quartz ring 58 (for simplicity, only one clip 56 is shown in FIG. 5). Quartz ring 58 reduces the thermal conduction between thermal plate 54 and top plate 34. The temperature of thermal plate 54 is measured by a thermocouple 60 imbedded therein (FIG. 5A).

A lower lamp assembly 62 is disposed beneath base plate 36 (FIG. 3) and includes eighteen (18) two-kilowatt lamps 64a and 64b. In the same manner that upper quartz window 45 is sealed to top plate 34, a lower quartz window 66 is provided within base plate 36 and vacuum sealed to base plate 36 via clamps 68, O-rings 70, 71, and a graphite gasket 72 (FIG. 5).

The wafer 12 is positioned within chamber 32 such that an outer edge of wafer 12 rests on a circular graphite carrier 74 (FIGS. 5A–5B). Preferably, carrier 74 should be as thin as possible (i.e., approximately 0.1 inches) so as to minimize thermal mass. This low thermal mass allows for the rapid thermal cycling of carrier 74.

A heat block 78 is disposed immediately below an outer portion of ring 74. An outer edge of ring 74 overlaps an inner edge of heat block 78, such that the bottom surface of carrier 74 and the top surface of heat block 78 are separated by approximately 0.04 inches. A quartz ring 80 provides thermal isolation between heat block 78 and base plate 36. A thermocouple 86 (FIG. 5b) imbedded in heat block 78 is sealed from the exterior of chamber 32 by O-ring 88 within thermocouple clamp 90 which, in turn, is sealed to side wall 38 by O-ring 92.

Carrier 74 is supported by a quartz ring 93 which is attached to a thermal plate 94. Preferably, plate 94 is graphite and exhibits a low thermal mass to allow for rapid thermal cycling of plate 94. Plate 94 is coupled to an upper end of a tube 96 which extends through chamber 32 via an opening in lower quartz window 66. Tube 96 passes through and may rotate freely within a ferrofluidic seal 98, which seals vacuum chamber 32 from exterior atmosphere (FIG. 4). The lower end of tube 96 is connected to and sealed to a shaft adapter 100. A belt 102 is situated around a first pulley 104, which is coupled to tube 96, and a second pulley 106, which is coupled to a motor 108. When motor 108 engages pulley 106, tube 96 rotates and thereby causes carrier 74 and, thus wafer 12, to rotate.

A shaft 110 situated within tube 96 has a lower end attached the inner portion of bellows 112 which, in turn, is coupled to a lift block 114. Lift block 114 is driven vertically by a motor 116 via an eccentric assembly 118. The upper end of shaft 110 is attached, via a shaft adapter 122, to a quartz pin holder 120 having attached thereto lift pins 124 (FIGS. 5 and 6). Lift pins 124 are used to raise wafer 12 above carrier 74 such that wafer 12 may be removed from chamber 32 via a robotic arm (not shown for simplicity).

A plug 125 having a gas fitting 126 disposed therein is provided in top plate 34 and connected to a channel 128 (FIGS. 4 and 5). An O-ring 130 seals plug 124 from exterior atmosphere, while an O-ring 132 seals plug 124 from the interior of chamber 32. Argon injected into gas fitting 126 flows through channel 128 and enters chamber 32 in the region between thermal plate 54 and upper quartz window 45, as indicated by arrow 133 (FIG. 5).

Figure 7:
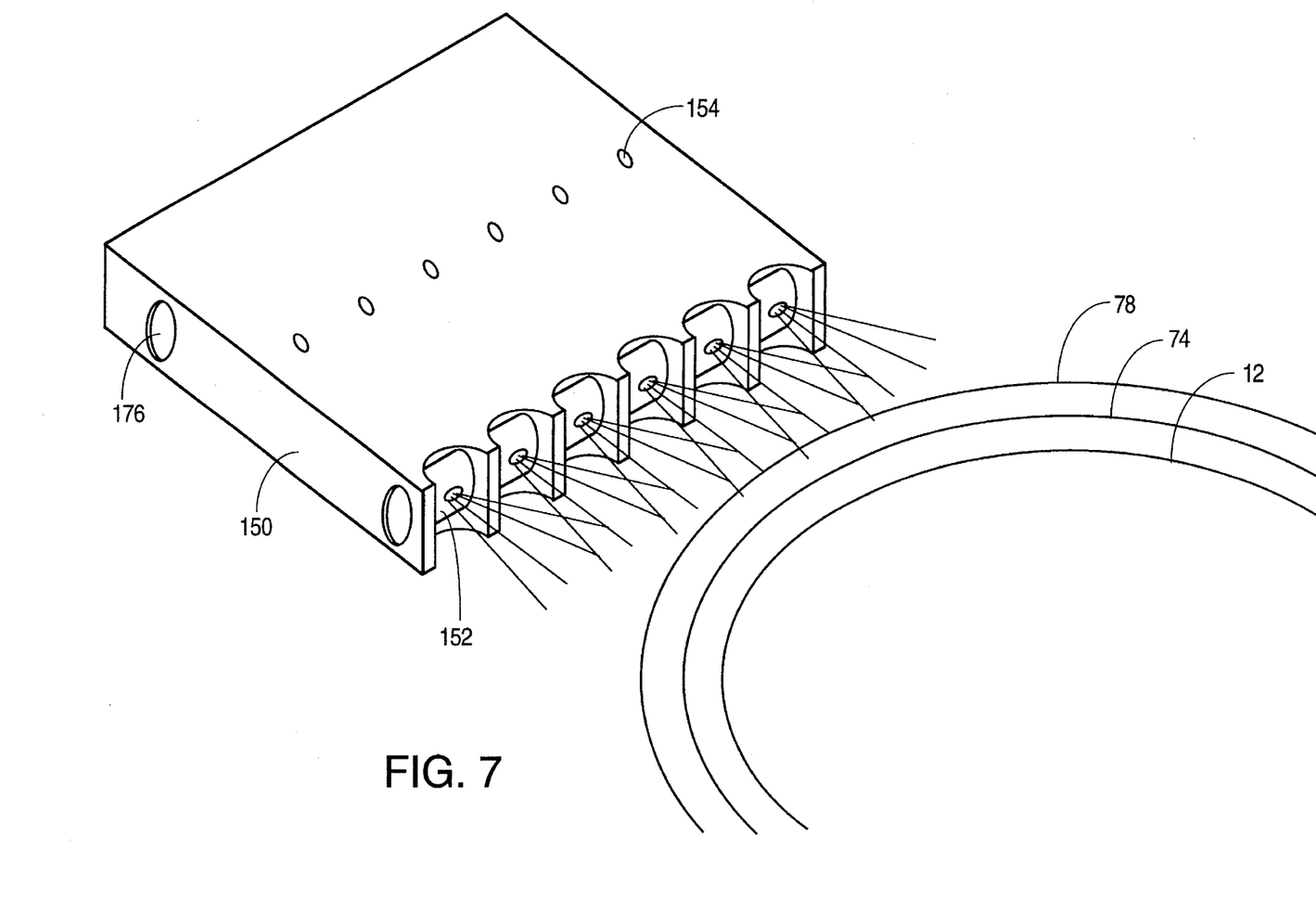
FIG. 7 is a perspective view of a multi-gas injector in accordance with the present invention.

Referring also to FIGS. 6 and 7, gas injector 40 includes an assembly 150 having six (6) independently rotatable nozzles 152 disposed on a side thereof. In some embodiments, nozzles 152 may rotate in vertical and horizontal directions. Nozzles 152 direct the flow of reactant gases towards the surface of wafer 12. Each of nozzles 152 has an associated control screw 154 which controls the flow rate and velocity of gas exiting from each nozzle 152.

Figure 8:
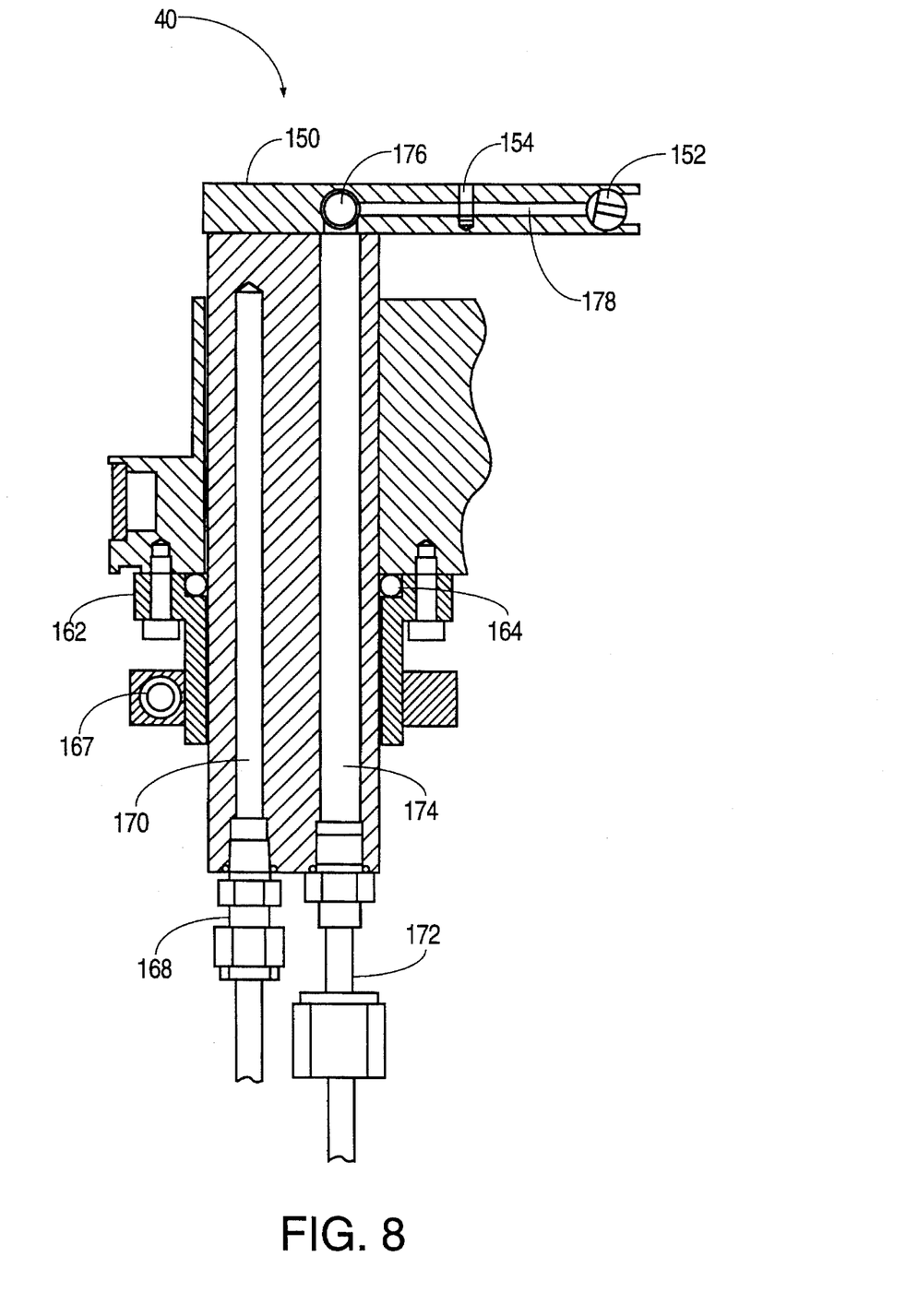
FIG. 8 is a cross-sectional view of the multi-gas injector of FIG. 7.

Gas injector 40 is secured to base plate 36 by clamp 162 (FIGS. 4 and 8). An O-ring 164 seals gas injector 40 to base plate 36. A Clamp 167 is also used to secure injector 40 in place. Water fittings 168 provided on the underneath side of injector 40 are connected to a water line 170 within assembly 40. Water is circulated through line 170 to cool injector 40.

Reactant gas injected into a tube 172 flows through a gas line 174 and enters a chamber 176 within assembly 150 of injector 40 (FIG. 8). Each of six gas lines 178 (only one is visible in FIG. 8 for simplicity) disposed within assembly 150 has a first end connected to chamber 176 and a second end connected to an associated one of nozzles 152. As explained earlier, gas flow through each of nozzles 152 may be controlled via an associated one of control screws 154 coupled to an associated one of gas lines 178.

Figure 9:
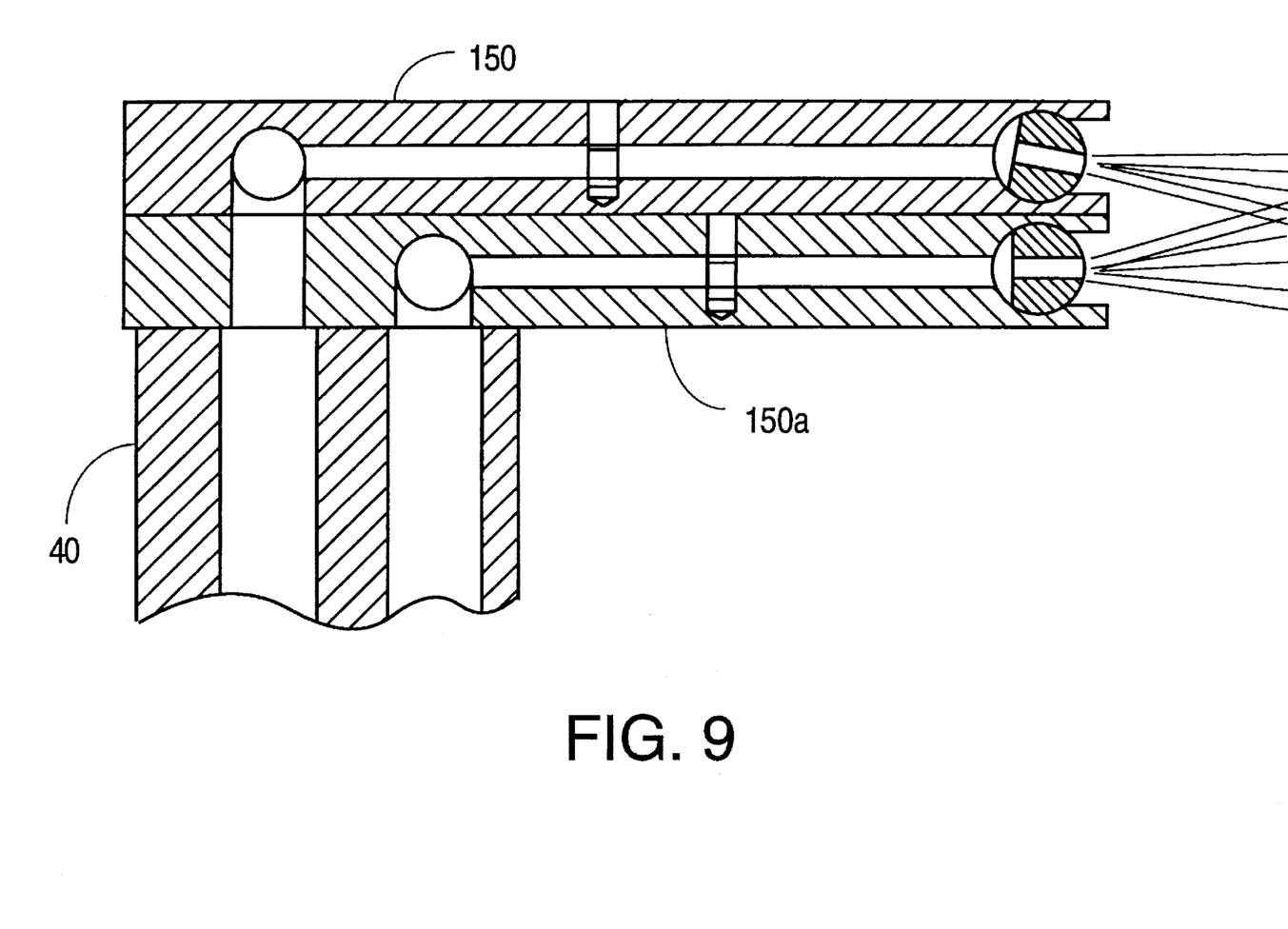
FIG. 9 illustrates a stacked gas injector in accordance with the present invention.

In another embodiment, gas injector 40 may be provided with two assemblies 150 stacked upon one another, as shown in FIG. 9. This arrangement allows two different reactant gases to be injected into chamber 32.

The gas injector 40 described above allows wafer 12 to be processed at rates much faster than those of conventional cold wall CVD devices without any resultant degradation in the uniformity of the polysilicon layer deposited on wafer 12. As discussed earlier, the deposition rate of polysilicon may be increased by increasing the partial pressure of the reactant gas. As the partial pressure is increased above approximately 10 mTorr, variations in the distribution pattern of the reactant gas over the surface of wafer 12 result in increasingly significant variations in the uniformity of the polysilicon layer deposited on wafer 12.

To solve this problem, wafer 12 is rotated while reactant gases are dispersed from injector 40 to chamber 32. The rotation of wafer 12 results in an averaging of the amount of gas available for deposition over the entire surface of wafer 12. Thus, non-uniformities in the distribution pattern of the reactant gas become have a much less significant impact upon the uniformity of the layer of polysilicon deposited on wafer 12. It is, nonetheless, desirable to maximize the uniformity of distribution pattern of the reactant gas so as to achieve the highest possible uniformity of the polysilicon layer. The uniformity of the reactant gas distribution pattern may be optimized by manipulating the orientation and flow rate of gas through each of nozzles 152.

Minimizing the significance of the distribution pattern of reactant gas allows the partial pressure of the reactant gas to be increased to approximately 200 mTorr which, in turn, allows for polysilicon deposition rates in excess of 2500 Å/min. This increased deposition rate is realized without sacrificing the uniformity of the polysilicon layer deposited on wafer 12. Thus, by reducing the gas boundary layer at the surface of wafer 12, gas injector 40 allows for higher deposition rates at a given partial pressure than do conventional cold wall CVD reactors.

Figure 10A:
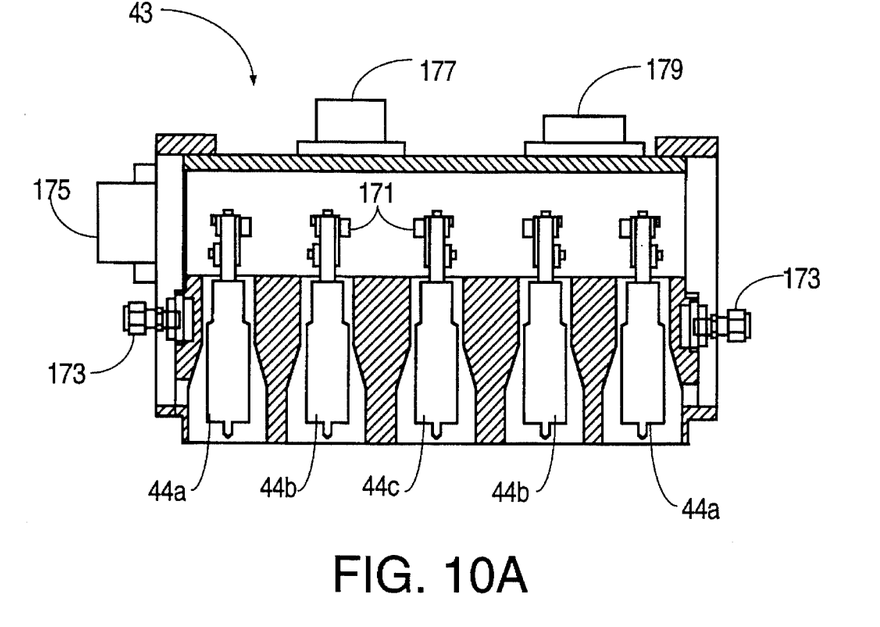
FIG. 10A is a cross-sectional view of a portion of the multi-zone heating assembly shown in FIG. 6.

FIG. 10A is a cross-sectional view of water-cooled upper lamp assembly 43 (see also FIG. 4). Lamp sockets 171 provided within lamp assembly 43 house the lamps 44a–44c described above. Water pumped into lamp assembly 43 via water fittings 173 circulates within and cools lamp assembly 43. Lamp sockets 171 are cooled by air entering lamp assembly 43 through a duct 179 and exiting lamp assembly 43 through a duct 175. Electrical power is provided to lamp assembly 40 through a socket 177.

Figure 10B:
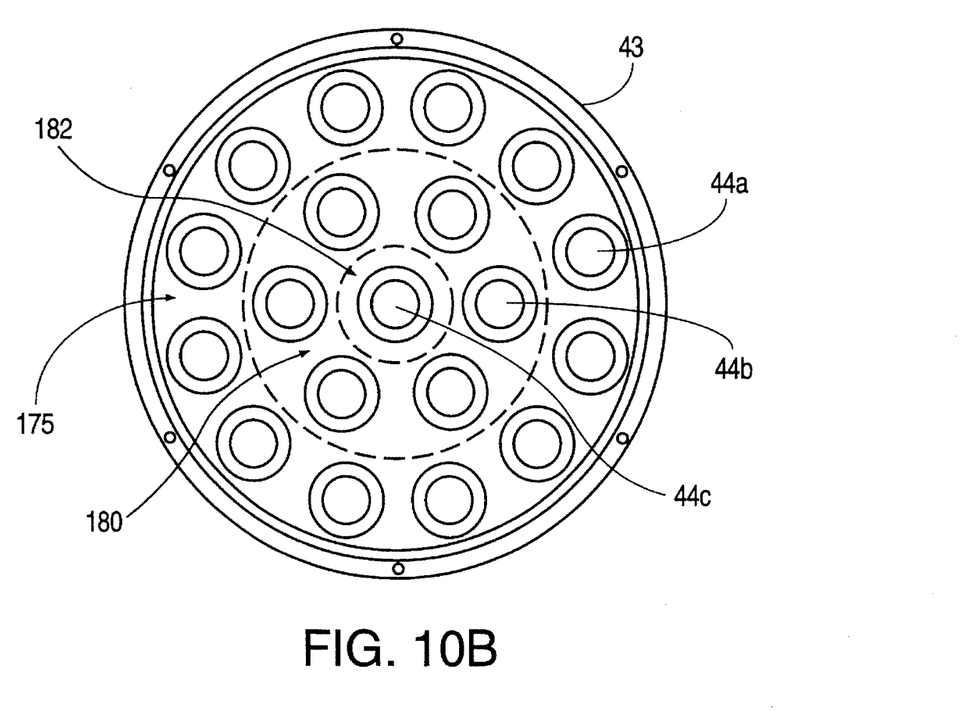
FIG. 10B is a bottom view of the heating assembly of FIG. 10A.

FIG. 10B is a bottom view of upper lamp assembly 43 illustrating three independent concentric heat zones 178, 180, 182. Outer zone 178 includes an outer ring comprising twelve lamps 44a, middle zone 180 includes an inner ring comprising six lamps 44b, and inner zone 182 includes lamp 44c at the center of lamp assembly 43.

Referring also to FIGS. 3 and 4, the arrangement of lamps in lower lamp assembly 62 is similar to that of upper lamp assembly 43, with an outer ring comprising twelve lamps 64a and an inner ring comprising six lamps 64b. However, lower lamp assembly 62 has no central lamp comparable to lamp 44c in upper lamp assembly 43 and instead has an opening through which tube 96 extends (FIG. 4).

Figure 11:
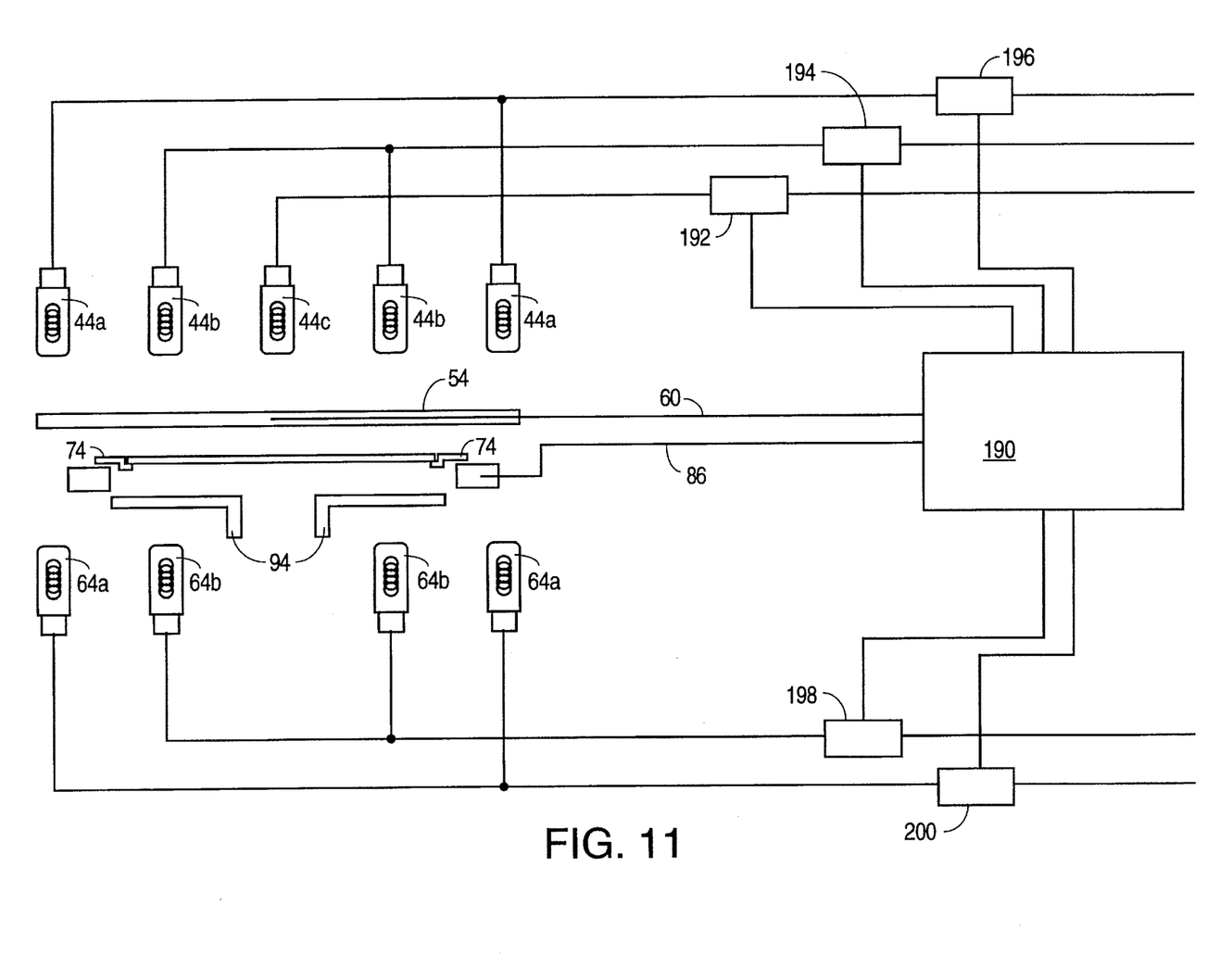
FIG. 11 is a schematic view of a temperature control system in accordance with the present invention.

Referring now to FIG. 11, a computer 190 regulates the temperature of wafer 12 by controlling the intensity of lamps 44a–44c and 64a–64b. Power to lamps 44a (outer zone 178), lamps 44b (middle zone 180), and lamp 44c (inner zone 182) of upper lamp assembly 43 is managed by silicon-controlled rectifier (SCR) controls 192, 194, and 196, respectively, while power to lamps 64a and 64b of lower lamp assembly 62 is managed by SCR controllers 198 and 200, respectively (see also FIGS. 9A and 9B). Each of SCR controllers 192–200 is controlled by a separate proportional integral derivative (PID) loops contained within the software of computer 190. These PIDs loops may be of conventional design.

The deposition of polysilicon on wafer 12 in accordance with the present invention will be discussed below. Wafer 12 is placed on carrier 74. Plate 94 should be positioned such that the top surface of plate 94 lies approximately 0.5 inches below the bottom surface of wafer 12. Wafer 12 is rotated at a speed of approximately 5 RPM while reactant gases are emitted from nozzles 152 (FIG. 5A). As described above with reference to FIGS. 7 and 8, the gas is distributed in a uniform manner over the surface of rotating wafer 12 via injector 40. Rotational speeds higher than about 5 RPM may cause wafer 12 to slide off ring 74.

Argon gas injected into reactor 30 through gas fitting 204 flows through channel 205 (FIG. 4) and enters chamber 32 at a rate of approximately 100 cc/min in a region below heat block 78, as indicated by arrows 206 (FIG. 5). The argon, flowing through the 0.04 inch gap between heat block 78 and carrier 74, prevents the reactant gas from coming into contact with lower quartz window 66. If the reactant gas were allowed to accumulate over quartz window 66, polysilicon would deposit on quartz window 66 and thereby reduce the efficiency of lamps 64a–64b within lower lamp assembly 62.

In a similar manner, argon gas injected into through gas fittings 126 enters chamber 32 in a region between upper quartz window 45 and plate 54 to prevent reactant gas from coming into contact with and depositing on upper quartz window 45 (FIG. 5).

Wafer 12 is indirectly heated from above by independently controlled lamps 44a, 44b, 44c of upper lamp assembly 43 (FIGS. 4, 10). Lamp 44c, i.e., inner zone 182, of upper lamp assembly 43 heats a center portion of thermal plate 54. The middle and outer portions of plate 54 are heated by lamps 44b (middle zone 180) and lamps 44a (outer zone 178) of upper lamp assembly 44, respectively. Computer 190 monitors the temperature of plate 54 via thermocouple 60 and in response thereto adjusts the power provided to lamp 44c so as to maintain plate 54 at a constant temperature. Computer 190 adjusts the power provided to lamps 44a and 44b based upon predetermined factors of the amount of power being provided to lamp 44c. That is, first and second predetermined percentages of the total power applied to lamps 44c is applied to lamps 44a and 44b, respectively. These predetermined factors are empirically determined by measuring the uniformity of the deposited polysilicon layer as a function of power provided to, and thus the temperature of, lamps 44a, 44b, and 44c. Applicants have found that optimization of the uniformity of the polysilicon layer is achieved where temperature variations exist across thermal plate 54, i.e., where the center of plate 54 is at a temperature different from, for instance, an outer portion of plate 54.

Plate 54 acts as a thermal diffuser between lamps 44a, 44b, 44c and wafer 12 to prevent hot spots on wafer 12 and, accordingly, helps to ensure the deposition of a uniform layer of polysilicon on wafer 12 (since directly heating wafer 12 with lamps 44a, 44b, 44c would almost certainly result in local hot spots on wafer 12 immediately below each of lamps 44a, 44b, 44c).

The outer edge of wafer 12 is indirectly heated primarily by the twelve outer lamps 64a of lower lamp assembly 62. Heat energy emitted from independently controlled lamps 64a is absorbed by heat block 78 which, in turn, heats the outer edge of wafer 12 (FIGS. 4 and 6). The temperature of heat block 78 is measured by thermocouple 86 and provided as feedback to computer 190. Computer 190 monitors this temperature and in response thereto adjusts the power provided to lamps 64a in order to maintain heat block 78 at a constant temperature. Surrounding the outer edge of wafer 12 by temperature-controlled heat block 78 thereby minimizes heat loss at the outer edge of wafer 12.

Wafer 12 is indirectly heated primarily from below by the six inner lamps 64b of lower lamp assembly 62 (FIGS. 4 and 6). Thermal plate 94 absorbs heat energy emitted from inner lamps 64b and, acting as a thermal diffuser in a manner similar to plate 54, heats wafer 12 from below. Computer 190 controls the power provided to inner lamps 64b based upon a predetermined factor of the amount of power being provided to outer lamps 64a. As discussed above, this predetermined factor is empirically determined by measuring the uniformity of the deposited polysilicon layer as a function of power provided to lamps 64a and 64b.

In other embodiments, the amount of power provided to lamps 64a and 64b, and thus the temperatures of heat block 78 and plate 94, respectively, are maintained as predetermined percentages of the power applied to upper lamps 44a.

Table 1 shows those predetermined percentages of power provided to each of lamps 44a, 44b, 44c, 64a, and 64b which Applicants have found to result in an optimization of the uniformity of the polysilicon layer at an operating temperature of 650 degrees Centigrade.

TABLE 1

| Zone | % of Power Applied to Lamps 44A | % of Full Power | Max. Watts | Actual Power |
|---|---|---|---|---|
| Lamps 44a | 100% | 33% | 24,000 | 7,920 W |
| Lamp 44c | 82% | 27% | 2,000 | 540 W |
| Lamps 44b | 27% | 9% | 12,000 | 1,080 W |
| Lamps 64b | 40% | 13% | 12,000 | 1,560 W |
| Lamps 64a | 73% | 24% | 24,000 | 5,760 W |

The reactor 30 described above with reference to FIGS. 3–11 minimizes temperature variations between the outer edge and center of a wafer. As mentioned earlier, wafer 12 exhibits a higher heat loss at its outer edge than at its inner portions. This higher heat loss at the outer edge is compensated by indirectly heating the outer edge of wafer 12 with independently controlled lamps 64a. Heat energy emitted by outer lamps 64a is absorbed by heat block 78 which, in turn, heats the outer edge of wafer 12. Since heat block 78 laterally surrounds the outer edge of wafer 74, the magnitude of heat energy radiating from heat block 78 and provided to wafer 12 is proportional to the distance from the outer edge of wafer 12, i.e., more heat energy is provided to the edge of wafer 12 than to portions of wafer 12 1 mm away from the outer edge, and so on. This feature, along with the continuous adjustment of lamps 44a–44c and 64a–64b by computer 190, allows for the deposition of a highly uniform layer of polysilicon on wafer 12.

Applicants have found that reactor 30 allows for the deposition of a polysilicon layer having less than 1% non-uniformity, as measured between the outer edge and a point 3 mm from the edge of a 200 mm diameter wafer, while achieving polysilicon deposition rates in excess of 2500 Å/min.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

We claim:

1. A CVD reactor comprising:

a chamber containing;

a first thermal plate, a second thermal plate positioned below said first thermal plate, wherein a wafer is interposed between said first and second thermal plates and not in contact with first and second thermal plates; and a thermal ring plate laterally surrounding an outer edge of said wafer;

a first heat source positioned above said first thermal plate, said first thermal plate absorbing heat energy emitted from said first heat source and heating said wafer;

a second heat source having first and second portions and positioned below said second thermal plate, said second thermal plate absorbing heat energy emitted from said first portion of second heat source and heating said wafer, said thermal ring plate absorbing heat energy emitted from said second portion of said second heat source and heating said outer edge of said wafer.

2. The device of claim 1 wherein said first and second thermal plates comprise graphite.

3. The device of claim 1 further comprising means for rotating said wafer.

4. The device of claim 3 wherein said first and second thermal plates have an emissivity of approximately 1.0.

5. The device of claim 1 wherein said first and second heat sources each comprise a plurality of tungsten halogen lamps.

6. The device of claim 1 further comprising:

a computer;

a first thermocouple embedded within said first thermal plate and coupled to said computer, said thermocouple measuring the temperature of said first thermal plate;

a second thermocouple embedded within said thermal ring plate and coupled to said computer, said second thermocouple measuring the temperature of said thermal ring plate;

wherein said computer adjusts the intensity of said first heat source in response to said temperature of said first thermal plate and adjusts the intensity of said first and second portions of said second heat source in response to said temperature of said thermal ring plate.

7. The device of claim 6 further comprising:

a second plurality of independently rotatable nozzles; and a plurality of third gas lines, each of said third gas lines being connected to an associated one of said second nozzles, wherein said shaft includes a fourth gas line having a first end connected to each of said third gas lines and having a second end connected to a second gas fitting such that a second gas, different from said first mentioned gas, injected into said second gas fitting may be directed toward said wafer through one or more of said second nozzles.

8. The device of claim 1 further comprising a gas injector for injecting a reactant gas into said chamber, said gas injector comprising:

a top plate having a plurality of independently rotatable nozzles and a plurality of first gas lines, each of said gas lines being connected to an associated one of said nozzles; and a shaft comprising a second gas line having a first end connected to each of said first gas lines and having a second end connected to a gas fitting, wherein said gas is injected into said gas fitting and is directed toward said wafer through one or more of said nozzles.

9. The device of claim 8 further comprising a plurality of controls, each of said controls being connected to an associated one of said first gas lines for controlling the velocity of gas flowing through each of said associated nozzles.

* * * * *